(12) United States Patent
Mathews et al.

(10) Patent No.: US 6,762,475 B2
(45) Date of Patent: Jul. 13, 2004

(54) SEMICONDUCTOR WAFER ISOLATION STRUCTURE FORMED BY FIELD OXIDATION

(75) Inventors: Viju K. Mathews, Boise, ID (US); Nanseng Jeng, Boise, ID (US); Pierre C. Fazan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/461,814

(22) Filed: Jun. 12, 2003

(65) Prior Publication Data

US 2003/0218232 A1 Nov. 27, 2003

Related U.S. Application Data

(63) Continuation of application No. 10/029,500, filed on Dec. 19, 2001, now Pat. No. 6,611,038, which is a division of application No. 09/234,329, filed on Feb. 11, 1999, now Pat. No. 6,365,490, which is a continuation of application No. 08/733,660, filed on Oct. 17, 1996, now Pat. No. 5,902,128.

(51) Int. Cl.$^7$ ............................................... H01L 21/76
(52) U.S. Cl. ........................................ 257/501; 257/506
(58) Field of Search .............................. 257/499, 501, 257/506, 510; 438/225, 297

(56) References Cited

U.S. PATENT DOCUMENTS

| | | | |
|---|---|---|---|
| 4,109,030 A | 8/1978 | Briska et al. | |
| 4,567,061 A | 1/1986 | Hayashi et al. | |
| 4,624,046 A | 11/1986 | Shideler et al. | |
| 4,748,134 A | * 5/1988 | Holland et al. | 438/440 |
| 4,959,325 A | 9/1990 | Lee et al. | |
| 5,087,586 A | 2/1992 | Chan et al. | |
| 5,139,967 A | 8/1992 | Sandhu et al. | |
| 5,159,428 A | 10/1992 | Rao et al. | |
| 5,169,491 A | 12/1992 | Doan | |
| 5,260,229 A | 11/1993 | Hodges et al. | |
| 5,294,563 A | 3/1994 | Rao | |
| 5,298,451 A | 3/1994 | Rao | |

(List continued on next page.)

FOREIGN PATENT DOCUMENTS

| | | | | |
|---|---|---|---|---|
| JP | 04074425 A | * | 3/1992 | .......... H01L/21/76 |
| JP | 153717 | * | 6/1996 | .......... H01L/21/76 |

OTHER PUBLICATIONS

Wolf, S., "Silicon Processing for the VLSI Era, Process Technology," vol. 1, (1996), pp. 216–218.
Wolf, S., "Silicon Processing for the VLSI Era," vol. 3, pp. 337–344.
Lutze, J.W., Perara, J.P. and Krusius, J.P., "Field Oxide Thinning in Poly Buffer LOCOS Isolation with Active Area Spacings to 0.1 βm," J. Electrochem. Soc., vol. 137, No. 6, (Jun. 1990), pp. 1867–1870.

Primary Examiner—Chandra Chaudhari
Assistant Examiner—David S. Blum
(74) Attorney, Agent, or Firm—Knobbe, Martens, Olson & Bear, LLP

(57) ABSTRACT

A method of forming isolation structures in semiconductor substrates comprising exposing a region of the semiconductor simultaneously to a transforming agent and to a viscosity reducing agent so that the transforming agent transforms a portion of the substrate into an isolation structure and the viscosity reducing agent reduces the viscosity of the isolation structure during formation. In one embodiment, a silicon substrate is exposed to oxygen in the presence of fluorine so that a silicon oxide isolation region is formed. The fluorine reduces the viscosity of the silicon oxide isolation region during formation which results in less lateral, bird's beak encroachment under adjacent masking stacks and also results in lower internal stress in the isolation region during formation. The lower internal stress and the lessened lateral encroachment result in thicker and improved isolation regions.

15 Claims, 4 Drawing Sheets

U.S. PATENT DOCUMENTS

| | | |
|---|---|---|
| 5,338,968 A | 8/1994 | Hodges et al. |
| 5,358,892 A | 10/1994 | Rolfson |
| 5,358,894 A * | 10/1994 | Fazan et al. ............... 438/440 |
| 5,369,051 A | 11/1994 | Rao et al. |
| 5,372,951 A | 12/1994 | Anjum et al. |
| 5,429,995 A | 7/1995 | Nishiyama et al. |
| 5,492,736 A | 2/1996 | Laxman et al. |
| 5,530,293 A | 6/1996 | Cohen et al. |
| 5,637,528 A | 6/1997 | Thakur et al. |
| 5,661,335 A | 8/1997 | Anjum et al. |
| 5,672,539 A | 9/1997 | Thakur et al. |
| 5,712,186 A | 1/1998 | Thakur et al. |
| 5,846,888 A | 12/1998 | Chapek et al. |
| 6,072,226 A | 6/2000 | Higashitani et al. |

\* cited by examiner

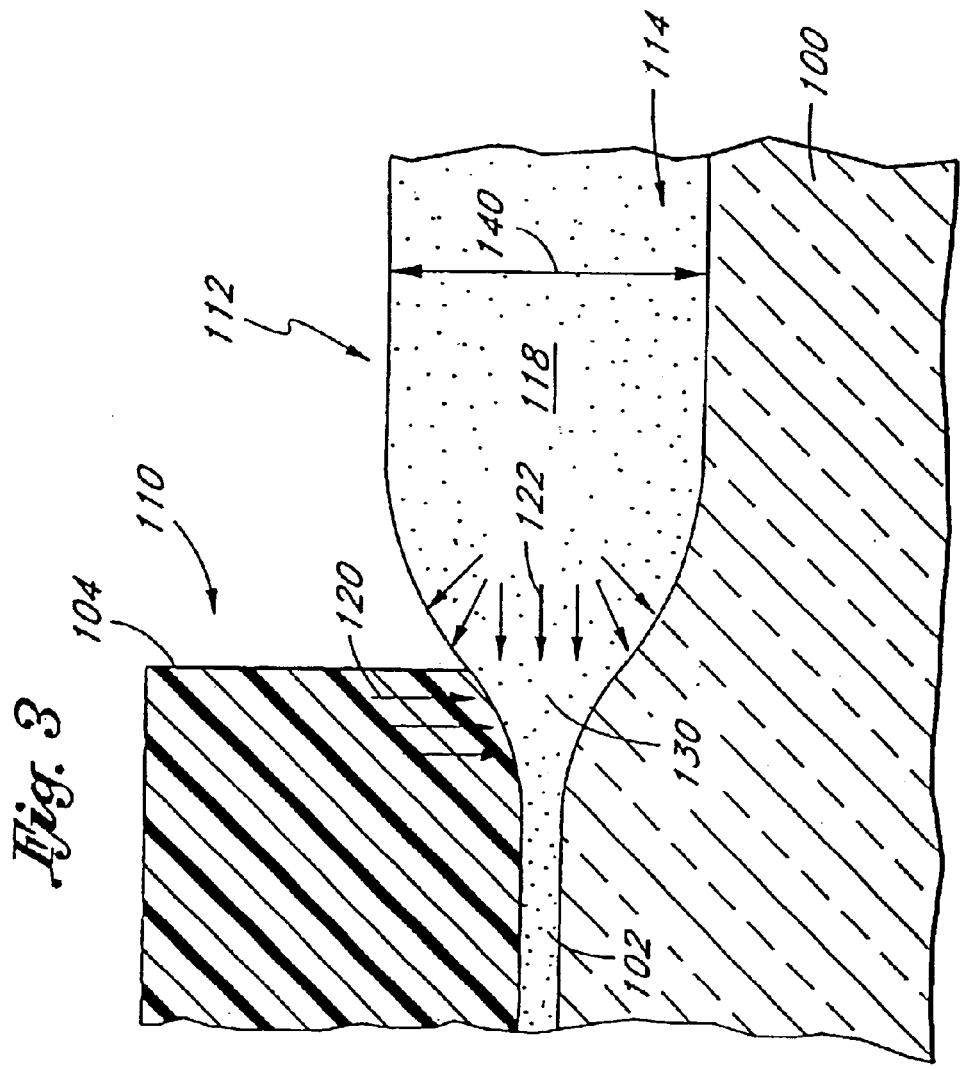

SEMICONDUCTOR WAFER ISOLATION STRUCTURE FORMED BY FIELD OXIDATION

REFERENCE TO RELATED APPLICATION

This application is a continuation of application Ser. No. 10/029,500, filed Dec. 19, 2001, now U.S. Pat. No. 6,611,088 which is a divisional of application Ser. No. 09/234,329, filed Feb. 11, 1999 (now U.S. Pat. No. 6,365,490, issued Apr. 2, 2002), which is a continuation of application Ser. No. 08/733,660, filed Oct. 17, 1996 (now U.S. Pat. No. 5,902,128, issued May 11, 1999).

BACKGROUND OF THE INVENTION

1. Field of the Invention

This invention generally relates to semiconductor integrated device design and fabrication and, more particularly, to techniques for isolating active areas of integrated circuits.

2. Description of the Related Art

As semiconductor integrated circuit technology advances to Ultra Large Scale Integration (ULSI) technologies, the devices on wafers shrink to sub-micron dimensions and the circuit density increases to several million devices per chip. Since the devices are closer together, isolation of the devices from each other becomes more problematic and more difficult to achieve. As such, the manufacturability and reliability of these devices are of great importance to the semiconductor industry and have received increasing attention recently.

For a given chip size, an increase in the number of active circuit components requires that they be placed in close proximity to each other, thus forcing a corresponding reduction in the surface area of the circuit that can be occupied by electrical isolation structures. The trend for reducing the chip surface area consumed by electrical isolation structures, while maintaining the necessary electrical isolation of adjacent active components, has led to the development of several different isolation techniques.

The most common isolation fabrication technique is a process known as LOCOS (for LOCalized Oxidation of Silicon). In the LOCOS process, the substrate is oxidized to form an isolation structure over the selected regions. These oxidized regions are known as field oxide regions; they are typically positioned so as to separate active areas on the wafer where devices, such as transistors, will subsequently be formed.

In the conventional LOCOS technique, the process typically begins with the growth of a thin pad oxide layer over the wafer surface. The function of this layer is to prevent transfer of stresses between the silicon substrate and the subsequently deposited layers. Following this, a layer of silicon nitride mask is deposited on top of the pad oxide layer and lithographically defined to retain the nitride over the active device regions of the wafer. The nitride layer is etched from the area between the active device areas where the field oxide (silicon dioxide) isolation structure is to be thermally grown.

Although the LOCOS process offers high reliability and proven high volume manufacturing compatibility, the effectiveness of this technique is limited by two important factors. One factor is active area loss due to lateral encroachment of the growing field oxide, often referred to as "bird's beak" encroachment, and the other factor is the problem of the field oxide isolation region thinning during formation which occurs especially in the narrow fields during the field oxide growth stage.

These problems are illustrated in FIG. 1, which shows a cross-section of a portion of a silicon substrate 40 having field oxide isolation regions 50a and 50b formed between a plurality of nitride masking stacks 60. The masking stacks 60 are positioned over the active areas 70 of the wafer 40. The lateral oxide encroachment into the active area is denoted by the distance labeled "W", and the field oxide thicknesses for the narrow and the wide regions are denoted as "$t^n_{ox}$" and "$t^w_{ox}$" in isolation structures 50a and 50b, respectively. The bird's beak encroachment is the result of lateral diffusion of the oxidants at the edges of the nitride masking stack and this bird's beak encroachment causes the oxide layer to grow under and lift the edges of the nitride masking stack.

Although the length of the lateral encroachment depends upon a number of parameters, including the thickness of the pad oxide, nitride and isolation oxide layers, as well as the oxidation temperature and pressure, the encroachment is generally related to the balance between the stress on the wafer from the masking stack, which inhibits the encroachment, and the stress generated by the growth of the field oxide which encourages encroachment. Both of these stresses introduce an increased number of stress induced defects into the silicon substrate adjacent to the active area thereby increasing the junction leakage current of devices formed in these areas and, as such, reducing the overall reliability of the device.

Another limitation of LOCOS isolation technologies for submicron structures is the phenomenon of the field oxide thinning effect. Typically, narrower field oxide isolation regions formed on the substrate are thinner than wider field oxide isolation regions. This is illustrated in FIG. 1 wherein the wider isolation region 50b on the right hand side is thicker than the narrower isolation region 50a on the left hand side ($T^n_{ox} < T^w_{ox}$). This inconsistent thickness of the field oxide isolation regions may also be associated with the build up of stress in the silicon substrate which can reduce the oxidation rate and hence the final oxide thickness.

Furthermore, for a given masking stack thickness on a wafer, the stress generated during the field oxide growth is observed to be a function of the field width. In fact, it is believed that the stress created by the field oxide growing in narrower spacings is sufficient to reduce the diffusivity of the oxidant through the oxide thereby reducing the thickness of the isolation regions. As a result of the field oxide thinning effect, device isolation characteristics in narrow isolation regions can be substantially reduced which can result in unwanted conductivity between the devices formed in adjacent active areas.

This problem has led to techniques for reducing the stress during the growth of the field oxide. For example, it is known that the stress exerted by the growing field oxide can be controlled by varying the viscosity of the field oxide. In particular, reducing the viscosity of the growing field oxide allows oxide to flow better. Methods of reducing the viscosity of the field oxide include employing either a high temperature oxidation process or a high pressure oxidation process (HiPOX). In semiconductor technology, a high temperature oxidation process can be either wet or dry oxidation carried out at a temperature of approximately 1000° C. High temperature oxidation generally reduces the thinning problem in narrow field oxidation regions. This is due to a decrease in field oxide viscosity, which results in an increased oxide flow and a decreased level of stress in the field oxide allowing greater oxide growth. Unfortunately, raising the growth temperature is not a reasonable solution to the bird's beak problem as higher temperatures severely increase bird's beak oxide encroachment under the nitride masking stack. Since both minimal isolation region thinning and lateral oxide encroachment are essential for a high quality and defect free isolation process, there is a need for a better process to provide required viscosity reduction.

In this respect, the HiPOx (for High Pressure Oxidation) process may comprise an improvement. In fact, the HiPOx process reduces the field oxide thinning effect and also reduces the length of bird's beak since the oxidation can be performed at a lower temperature range and in a shorter time period under the high pressure. A HiPOx process is typically carried out at a temperature range of 900–1000° C. and under a pressure range of 20–25 Atm. The oxidation process takes place in a high pressure furnace by using an $O_2$ gas ambient (dry oxidation) or a steam of $H_2O$ (wet oxidation) as oxidants.

However, even though the HiPOx process provides some advantages over other field oxide growth techniques, problems with the process and the special high pressure equipment have limited its acceptance in the industry. In particular, there are significant safety problems associated with high pressure oxidation due to the high pressure gasses that are used during the process. To address these safety problems, and also to accomplish the process, expensive and large high pressure furnaces and related equipment must be used to perform the process.

As is apparent, there is a need in current semiconductor technology for improved methods of forming isolation regions to reduce lateral encroachment and thinning of the isolation structures, thereby permitting smaller isolation structures to be used. To this end, there is a need to reduce the viscosity of the oxide during the field oxidation isolation process, thereby reducing the stress during the oxidation processes. Further, there is a particular need for a technique for forming isolation regions whereby the viscosity is lowered without using special equipment and the thickness is, to a high degree, uniform.

SUMMARY OF THE INVENTION

The aforementioned needs are satisfied by the process of the present invention which comprises exposing regions of a semiconductor wafer to an isolation structure forming agent and a viscosity reducing agent. The isolation structure forming agent changes regions of the semiconductor wafer into isolation structures and the viscosity agent decreases the viscosity of the isolation structures during formation. As a result of the decrease in viscosity, lateral encroachment of the isolation structures into adjacent active areas is reduced. Additionally, the decrease in the viscosity is accompanied by a decrease in the internal stress in the isolation structure during formation which enhances diffusion of the isolation structure forming agent to the semiconductor substrate, thereby resulting in thicker isolation structures.

In the preferred embodiment, a semiconductor wafer is masked and then regions of the wafer are exposed. An oxidation step is then performed whereby the semiconductor wafer is oxidized to form the isolation structure. During at least some of the time that the oxidation step is performed, a doping agent that reduces the viscosity of the oxidized semiconductor agent is added to the oxidation step. In one particular implementation, a silicon wafer is oxidized in the presence of fluorine which results in a silicon oxide isolation structure that has a decreased viscosity during formation.

The decrease in viscosity results in a decrease in the forces that prompt volumetric expansion of the isolation structure. This inhibits volumetric expansion underneath masking stacks as the masking stacks exert a compressive force on the portion of the silicon substrate underneath the masking stack. Hence, there is less lateral encroachment, i.e., bird's beak encroachment, of the silicon oxide isolation structure into the regions under the masking stacks that can comprise the locations of active areas of the wafers.

Further, the decrease in viscosity of the silicon oxide results in oxygen molecules more readily diffusing through the silicon oxide isolation structure under formation to the interface between the silicon substrate and the silicon oxide isolation structure. This results in thicker silicon oxide isolation structures and is particularly useful in applications requiring very narrow isolation structures.

These and other objects and advantages of the present invention will become more fully apparent from the following description taken in conjunction with the accompanying drawings.

BRIEF DESCRIPTION OF THE DRAWINGS

FIG. 3 is a detailed cross-sectional view of the wafer shown in FIG. 2D wherein the stresses and forces occurring during the growth of the isolation region of the preferred embodiment are schematically illustrated.

DETAILED DESCRIPTION OF THE PREFERRED EMBODIMENT

Figure 1:
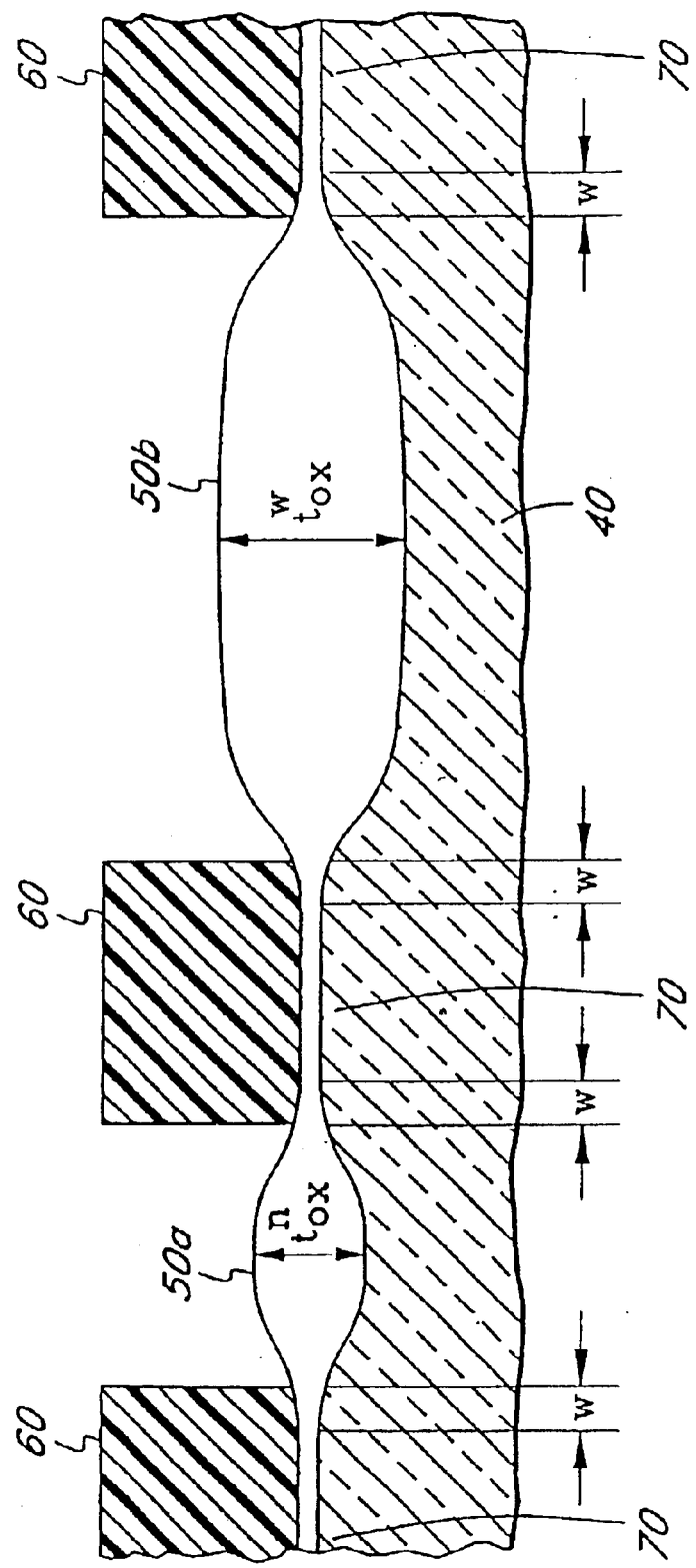
FIG. 1 is a cross-sectional view of a silicon wafer portion of the prior-art having a patterned nitride mask and field oxide isolation regions grown on the top surface.
Figure 2A:
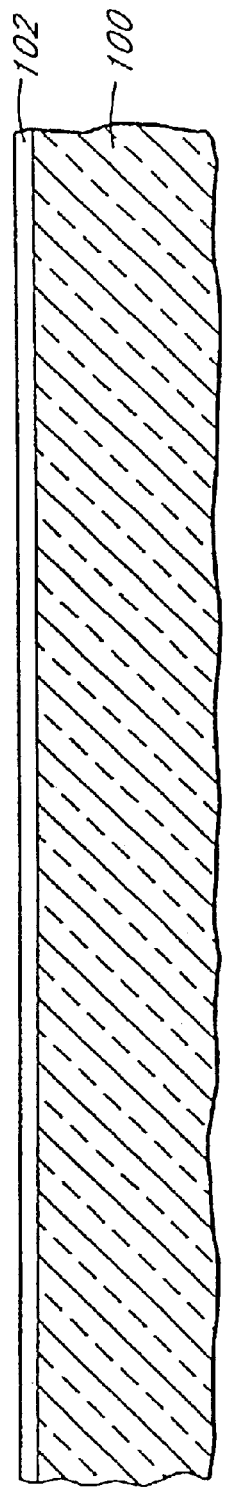
FIG. 2A is a cross-sectional view of a silicon wafer portion having a pad oxide layer grown on the top side.

Reference will now be made to the drawings wherein like numerals refer to like parts throughout. FIG. 2A illustrates that a buffer layer 102 is initially grown on a silicon substrate 100. Specifically, in the preferred embodiment, the buffer layer 102 is comprised of a thin layer of silicon dioxide ($SiO_2$) of about 20–300 Å thick that is grown on a clean surface of the silicon wafer 100. This $SiO_2$ layer is generally known as pad oxide layer 102 and provides a stress-relief buffer between the silicon surface and an overlying layer of masking material.

It will be understood that the semiconductor "substrate," as used herein, refers to a semiconductor layers or structure which includes active areas (e.g., transistor source/drains) of semiconductor devices. For instance, the substrate may comprise a monocrystalline silicon wafer, or a silicon structure over an insulating layer for integrated circuits employing silicon-on-insulator (SOI) technology.

Figure 2B:
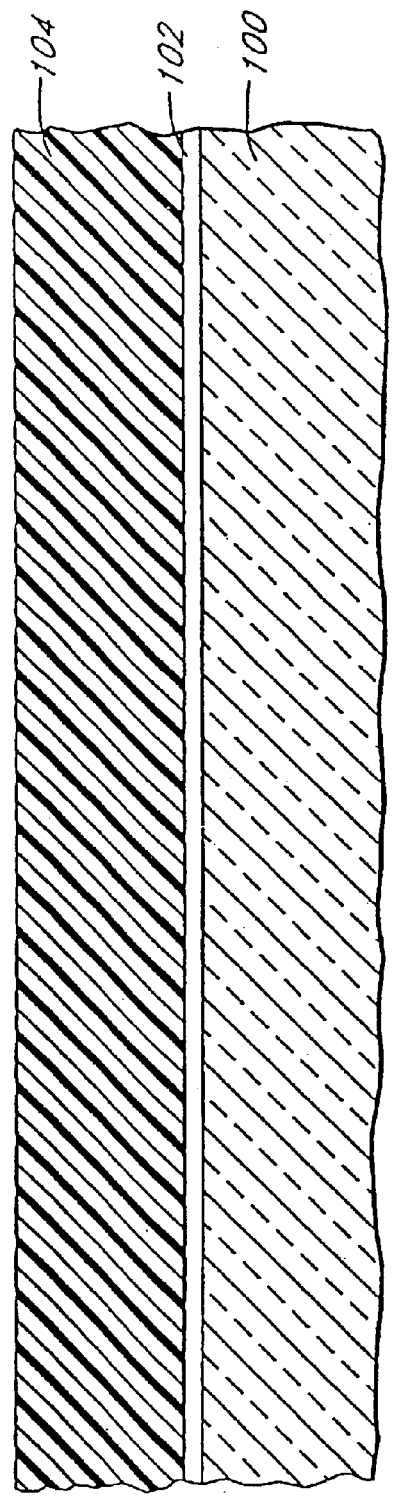
FIG. 2B is a cross-sectional view of the wafer shown in FIG. 2A wherein a layer of silicon nitride has been deposited on the top of the pad oxide layer.

FIG. 2B illustrates that, subsequent to the growth of the pad oxide layer 102, a layer of masking material 104 is formed on the pad oxide layer 102. In the preferred embodiment, the layer of masking material 104 is comprised of a layer of silicon nitride that is about 2000 Å thick. As is understood in the art, the silicon nitride layer 104 is essentially an oxidation masking material which is used during the formation of field oxide isolation regions on the substrate 100. The silicon nitride layer 104 is typically deposited by a chemical vapor deposition (CVD) of dichlorosilane ($SiH_2Cl_2$) and ammonia ($NH_3$) at temperatures between about 600° C. and 800° C., according to the overall reaction:

$$3SiH_2Cl_2 + 4NH_3 \rightarrow Si_3N_4 + 6HCl + 6H_2$$

Figure 2C:
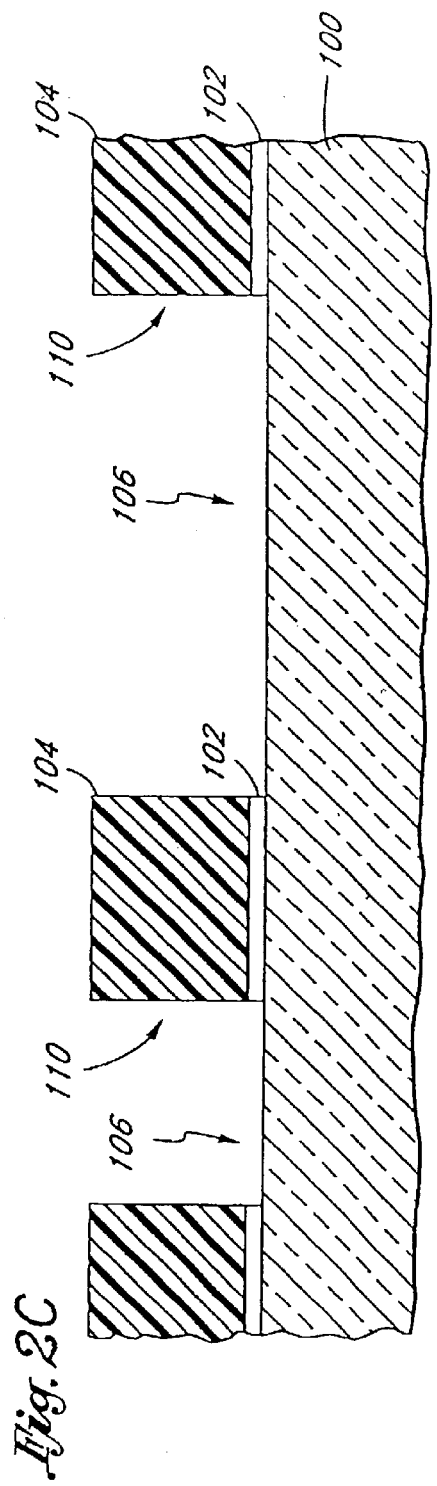
FIG. 2C is a cross-sectional view of the wafer shown in FIG. 2B wherein the nitride masking stack has been patterned and etched to expose regions of the substrate where isolation structures are to be formed.

As shown in FIG. 2C, the process is followed by the patterning of the masking layer 104 with a photoresist pattern and etching through the masking material 104 to expose and define a plurality of regions 106 on the silicon substrate 100 where isolation structures are to be formed. As shown in FIG. 2C, the patterning and etching of portions of the masking material 104 also results in the formation of a plurality of masking stacks 110, comprised of portions of the layer of masking material 104 and the layer of buffer material 102 on the first surface of the substrate 100.

As will be described below, the thickness and the mechanical properties of the masking stack 110 influence the quality of the isolation structures formed in the regions 106. In general, a thicker mask stack 110 allows less bird's beak oxide encroachment during the field oxide growth, since a thicker masking layer is stiffer and resists the edge lifting that accompanies bird's beak penetration. However, if the nitride layer is too thick, it is likely to crack. In the preferred embodiment, the thickness of the masking stack 110 is optimized between about 1500 Å and 2500 Å.

Figure 2D:
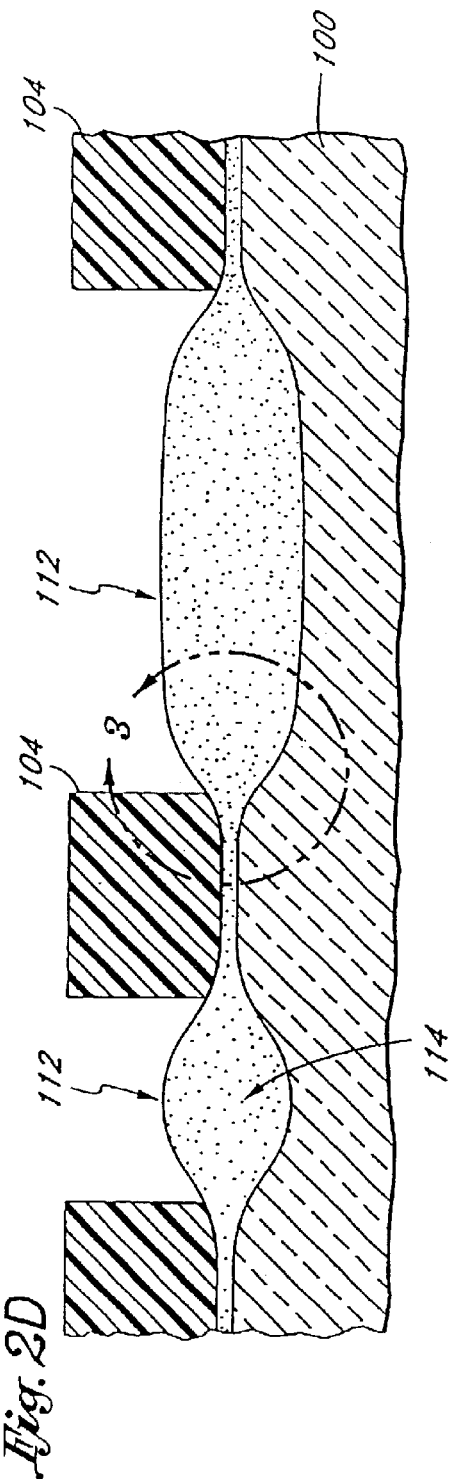
FIG. 2D is a cross-sectional view of the wafer shown in FIG. 2C wherein field oxide isolation structures are formed in the substrate using the method of the preferred embodiment.

As illustrated in FIG. 2D, after the formation of the nitride mask 110, a plurality of field oxide isolation regions 112 are then thermally grown at the exposed regions 106 of the silicon substrate 100. As is understood, the field oxide regions 112 can be grown by means of either wet oxidation (water steam) or dry oxidation ($O_2$ gas) according to the general formulas:

$$Si(solid) + 2H_2O(water\ steam) \rightarrow SiO_2 + 2H_2$$

$$Si(solid) + O_2(gas) \rightarrow SiO_2$$

In the preferred embodiment of the invention, the field oxide growth is carried out by means of atmospheric pressure wet oxidation at a temperature range of approximately 1000° C. and to a thickness of approximately 2000 Å. However, as a departure from the prior art oxidation techniques, a viscosity reducing agent or dopant is also introduced into the wet oxidation ambient so as to apply viscosity reducing dopant atoms, schematically represented in FIG. 2D by reference number 114, to the growing field oxide regions 112.

Preferably, the dopant is fluorine which can be introduced into oxidation ambient by a variety of fluorine containing gases such as $NF_3$, $CF_4$, $SF_6$, $C_2F_6$ or $SiF_4$. The final field oxide regions 112 of the preferred embodiment contain approximately 1% by weight of fluorine dopant and the amount of fluorine dopant incorporation into the field oxide is controlled by the flow rate of the fluorine containing gas during the field oxide oxidation. As an example, in the present invention, preferably, a $NF_3$ gas with 5–25 sccm flow rate at 900–1150° C. is used. In accordance with the principles of the present invention, the deliberate introduction of a viscosity reducing agent, such as a fluorine species, into the oxidation ambient causes a reduction in the viscosity of the growing field oxide.

FIG. 3 illustrates the effects of the introduction of the viscosity reducing agent during the formation of the isolation region 112 in greater detail. Specifically, FIG. 3 illustrates that the masking stack 110 exerts a force, represented by the arrows 120, that is generally directed downward and is generally compressive against the substrate 100. Further, during the growth of the field oxide isolation regions 112, the volumetric expansion of the field oxide isolation region 112 exerts a force in the direction of the arrows 122 inward and under the masking stack 110. Typically, there is a portion 130 of the field oxide isolation region 112 (the Bird's beak) that laterally encroaches underneath the masking stack 110 during the field oxidation step.

It will be appreciated that at an equilibrium point, the downward force 120 will be balanced by the inward force 122 thereby limiting the size of the Bird's beak portion 130 encroaching under the masking stack 110. Furthermore, during the formation step, the material that is transforming the substrate 100 into the isolation region 112 preferably diffuses through the isolation region 112 after the initial reaction and transforms individual atoms of the substrate into the material of the isolation region, i.e., transforms the silicon substrate 100 into a silicon oxide in the preferred embodiment. The viscosity reducing agent has the tendency to reduce the overall viscosity of the material forming the isolation region 112 while the region 112 is under volumetric expansion.

Hence, in the preferred embodiment, the inward force 122 exerted on the substrate 100 as a result of the volumetric expansion of the isolation region 112 is lowered. This results in the bird's beak portion 130 of the region 112 being reduced and, since there has been a reduction in the overall amount of stress on the semiconductor substrate 100, fewer stress induced defects are formed in the substrate 100.

Furthermore, it will be appreciated that if the growth of the field oxide isolation region 112 into the substrate 100 positioned under the masking stack 110 is limited, then additional growth of the field oxide isolation region 112 will have a greater tendency to occur towards the center 118 of the isolation region thereby reducing the problem of thinning isolation regions. In other words, if the force 122 of expansion underneath the masking stacks 110 is lowered as a result of the decrease in the viscosity of the material forming the isolation region, then the compressive force 120 will have the tendency to increase the thickness of the field oxide region 112 as represented by the arrow 140.

In the preferred embodiment, the formation of the isolation regions 112 occurs as a result of the oxygen molecules diffusing into the substrate 100 and bonding with a silicon atom to form silicon oxide. The addition of the fluorine results in some of the fluorine atoms bonding with the silicon atoms in the substrate 100. It will be appreciated that, as the isolation region 112 grows, the oxygen molecules will have to diffuse through the isolation region 112 to reach the silicon substrate 100. This diffusion is hampered, in the prior art, by internal stresses in the growing isolation region 112 which contributes to the thinning of the isolation region 112.

By adding the viscosity reducing agent 114, e.g., fluorine in the preferred embodiment, the stress within the isolation region 112 during growth is lowered which allows for more diffusion of oxygen molecules to the silicon substrate 100. Consequently, the addition of the viscosity reducing agent in the preferred embodiment results in thicker field oxide isolation regions 112 as the oxygen molecules can more readily diffuse through the center of the isolation region 112.

It will be appreciated that the stress build up in the isolation region 112 is more pronounced in narrower isolation regions, i.e., regions that occupy smaller surface areas of the semiconductor substrate. Hence, lowering the viscosity by the addition of the viscosity reducing agent allows for smaller dimensioned isolation structures while minimizing both the problems of field oxide thinning and lateral, bird's beak, encroachment. In addition, the process of the preferred embodiment can be performed using equipment and techniques of the prior art and does not require the addition of expensive high pressure equipment to perform the process.

Hence, it will be understood that fluorine doping reduces the viscosity of the field oxide during growth of the field oxide isolation regions 112 and allows the field oxide to grow in thickness rather than grow laterally. Clearly, the masking stack 110 becomes significantly more effective against the penetrating bird's beak if the viscosity of the field oxide is lower, thereby reducing the encroaching force 122. Thus, due to the lower viscosity of the field oxide, nitride masking stack edges are more resistant to lifting caused by the penetrating bird's beak region 130. As a result, a shorter bird's beak oxide encroachment is also achieved.

It would be understood that the improved LOCOS technique provided by this embodiment discloses a method for reducing the viscosity of the growing field oxide by means of adding a fluorine containing gas into the oxidation ambient. The presence of fluorine in the forming field oxide lowers the viscosity and allows it to flow more readily at conventional processing temperatures (1000° C.), thereby reducing the internal stress of the growing field oxide. Furthermore, in connection with the viscosity, reducing the internal stress results in shorter bird's beak oxide encroachment and less oxide thinning. Additionally, the fluorine incorporated oxidation step of the process eliminates the use of expensive high pressure or high temperature oxidation processes to decrease viscosity of the growing field oxide. Therefore, the process is inexpensive and efficient.

Hence, although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention. Consequently, the scope of the present invention should not be limited to foregoing discussions, should be defined by the appended claims.

We claim:

1. A semiconductor substrate comprising:
    a first isolation structure positioned in said substrate wherein said first isolation structure is formed by a LOCOS process from an isolating material and has a first width and a first thickness; and
    a second isolation structure positioned in said substrate wherein said second isolation structure is formed by said LOCOS process from said isolating material and has a second width, which is greater than said first width, and a second thickness which is substantially equal to said first thickness,
    wherein said isolation structures have a substantially similar composition, wherein isolating material comprising said first and said second isolating structures includes a viscosity reducing agent wherein said viscosity reducing agent reduces a viscosity of said isolation material relative to said isolation material without said viscosity reducing agent, wherein said viscosity reducing agent comprises fluorine and wherein fluorine comprises about 1% by weight of said isolation structures.

2. The semiconductor substrate of claim 1, wherein said first and said second isolation structures have substantially equal thicknesses as a result of said reduced viscosity of said first and said second isolation structures.

3. The semiconductor substrate of claim 1, wherein a bird's beak encroachment of said second isolation structure is reduced relative to a similar isolation structure without said viscosity reducing agent.

4. A semiconductor substrate comprising:
    a first isolation structure in said substrate, wherein said first isolation structure includes a viscosity reducing agent, has a first width and a first thickness, and is formed by oxidation of a region of said substrate with an oxidizing agent; and
    a second isolation structure in said substrate, wherein said second isolation structure includes said viscosity reducing agent, is formed by oxidation of a different region of said substrate with said oxidizing agent and has a second width, which is greater than said first width, and a second thickness which is substantially equal to said first thickness,
    wherein said viscosity reducing agent comprises about 1% by weight of said isolation structure.

5. The semiconductor substrate of claim 4, wherein said first and said second isolation structures have substantially equal thicknesses as a result of said viscosity reducing agent reducing a viscosity of said first and said second isolation structures relative to a viscosity of said isolation material without said viscosity reducing agent.

6. The semiconductor substrate of claim 4, wherein a bird's beak encroachment of said second isolation structure is reduced relative to a similar isolation structure without said viscosity reducing agent.

7. The semiconductor substrate of claim 4, wherein said viscosity reducing agent comprises fluorine.

8. The semiconductor substrate of claim 4, wherein fluorine comprises about 1% by weight of said isolation structures.

9. An integrated circuit comprising:
    a substrate of semiconductor material; and
    an isolation region formed therein,
    wherein said isolation region is formed in said substrate through oxidation of a region of said substrate by an oxidizing agent, wherein said oxidizing agent includes a viscosity reducing agent, wherein said viscosity reducing agent comprises about 1% by weight of said isolation region.

10. The integrated circuit of claim 9, wherein the viscosity reducing agent comprises fluorine.

11. The integrated circuit of claim 9, further comprising an active area configured to receive an active device positioned adjacent said isolation region.

12. The integrated circuit of claim 11, wherein lateral encroachment of said isolation region into said active area is reduced relative to said isolation region without said viscosity reducing agent.

13. The integrated circuit of claim 12, wherein said substrate is comprised of silicon and said oxidizing agent is comprised of oxygen.

14. An integrated circuit including a semiconductor substrate, said semiconductor substrate comprising:
    an active component on a top surface of said substrate; and
    an isolation region in said substrate, wherein said isolation region includes a bird's beak structure at an interface with said component and wherein a viscosity reducing agent comprises about 1% by weight of said isolation region.

15. The integrated circuit of claim 14, wherein said viscosity reducing agent comprises fluorine.

* * * * *

UNITED STATES PATENT AND TRADEMARK OFFICE
CERTIFICATE OF CORRECTION

PATENT NO. : 6,762,475 B2
DATED : July 13, 2004
INVENTOR(S) : Mathews et al.

It is certified that error appears in the above-identified patent and that said Letters Patent is hereby corrected as shown below:

Title page,
Item [56], References Cited, OTHER PUBLICATIONS,
"Lutze" reference, delete "βm" and insert -- $\mu$m -- therefor.

Column 7,
Line 40, insert -- but -- before "should.".

Signed and Sealed this

Sixteenth Day of August, 2005

JON W. DUDAS
*Director of the United States Patent and Trademark Office*